United States Patent [19]

Lambourn

[11] 4,156,871

[45] May 29, 1979

[54] ANALOG-TO-PULSE DENSITY CONVERTER

[75] Inventor: Edward H. Lambourn, Enfield, England

[73] Assignee: International Standard Electric Corporation, New York, N.Y.

[21] Appl. No.: 773,884

[22] Filed: Mar. 3, 1977

[30] Foreign Application Priority Data

Apr. 1, 1976 [GB] United Kingdom ........ 13160/76

[51] Int. Cl.² ............................................ H03K 13/02
[52] U.S. Cl. ........................ 340/347 AD; 340/347 NT
[58] Field of Search ................. 340/347 NT, 347 AD; 325/38 R, 38 B; 307/359

[56]  References Cited
U.S. PATENT DOCUMENTS

| 3,480,948 | 11/1969 | Lord ............................. 340/347 NT |
| 3,810,151 | 5/1974 | Johnston ...................... 340/347 AD |
| 3,859,654 | 1/1975 | Harrison ....................... 340/347 NT |
| 4,009,475 | 2/1977 | DeFreitas ..................... 340/347 NT |

Primary Examiner—Charles D. Miller
Attorney, Agent, or Firm—John T. O'Halloran; Jeffrey P. Morris

[57] ABSTRACT

The analog-to-pulse density converter of U.S. Pat. No. 3,955,191 is modified to provide high stability gain with temperature compensation, auto-centering and defined d.c. offset to reduce noise at low signal levels. The modified circuit has reduced power dissipation. The modulator has a stabilized current switching circuit feeding an RC network which is terminated by two D-type flip flops clocked by a high frequency pulse train. Negative feedback from both of the flip flops causes the circuit to generate a pulse density modulated (PDM) output signal related to a given input signal.

31 Claims, 5 Drawing Figures

ANALOG-TO-PULSE DENSITY CONVERTER

BACKGROUND OF THE INVENTION

The present invention relates to an analog-to-digital converter and is particularly applicable for use in single channel digital speech transmission equipments.

My U.S. Pat. No. 3,955,191 discloses an analog-to-pulse density converter including a single D-type flip flop, a clock source to clock the flip flop, an analog signal input coupled to the D input of the flip flop and at least one feedback circuit connected from the $\bar{Q}$ output of the flip flop to the D input of the flip flop. The feedback circuit includes a circuit to integrate the $\bar{Q}$ output signal of the flip flop.

SUMMARY OF THE INVENTION

An object of the present invention is to provide a modification of the analog-to-pulse density converter of my U.S. Pat. No. 3,955,191.

Another object of the present invention is to provide an analog-to-pulse density converter having high stability gain with temperature compensation, auto-centering, a defined d.c. offset to reduce noise at low signal levels and reduced power dissipation.

A feature of the present invention is the provision of an analog-to-digital converter comprising: a first bistable trigger circuit having only one conditioning input and a complementing output; first means coupled to the first trigger circuit to apply a clock signal thereto; second means coupled to the conditioning input of the first trigger circuit to apply an analog signal to be digitized thereto; a first feedback circuit coupled from the complementing output to the conditioning input of the first trigger circuit; a second bistable trigger circuit having only one conditioning input coupled to the complementing output of the first trigger circuit and a normal output, the second trigger circuit being coupled to the first means to have the clock signal applied thereto; and a second feedback circuit coupled from the normal output of the second trigger circuit to the second means.

The output of this type of converter is a pulse stream in which the density of the pulse, i.e. the average number of pulses in a given period, is proportional to the amplitude of the signal being digitized. The nominal pulse frequency of the stream remains constant at all times.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENTS

Figure 1:
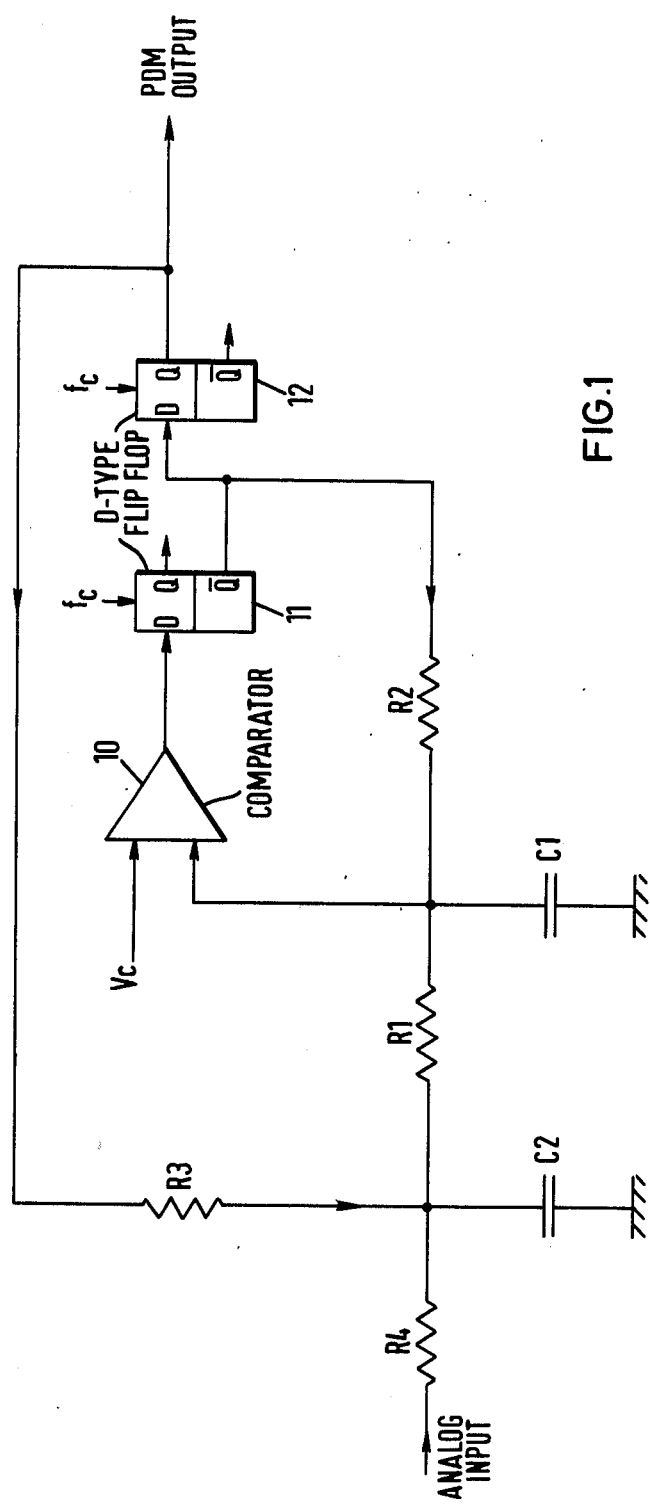
FIG. 1 illustrates a simple analog-to-digital converter in accordance with the principles of the present invention.

In the arrangement illustrated in FIG. 1, an analog input signal is applied via resistors R4, R1 and comparator 10 to the input D of a bistable trigger device 11, such as a D-type flip flop, in which the sign of the normal output Q will correspond to that of the input and the sign of the complementary output $\bar{Q}$ will be the inverse of the sign of the input whenever the device is triggered by a clock signal $f_c$. The $\bar{Q}$ output is applied via a feedback path, which includes resistor R2, to the comparator input. The comparator input is also connected to capacitor C1, which for convenience is shown as being grounded at its other terminal. The $\bar{Q}$ output of device 11 is also applied to the conditioning input D of a second similar device 12 the Q output of which is applied via a second feedback path, which includes resistor R3, to the junction of resistors R4 and R1. This junction is also connected to capacitor C2, which for convenience is shown as being grounded at its other terminal. Device 12 receives the same clock signal $f_c$ as device 11. The other input of comparator 10 receives a reference voltage $V_c$.

Consider first the action of the circuit in the absence of an input signal. The voltage e across the capacitor C1 is derived from the $\bar{Q}$ output of the device 11. When the $\bar{Q}$ output goes positive, the voltage e rises and crosses the triggering threshold level $V_c$ for comparator 10. When next the device 11 is clocked, the positive voltage at the D-input causes $\bar{Q}$ to go negative. This causes the voltage on the capacitor C1 to go negative and, at the next clock pulse, $\bar{Q}$ will go positive. The time constants of the circuit components are chosen so that the $\bar{Q}$ output changes sign every alternate clock pulse.

Ignoring for the moment device 12, resistors R3, R4 and capacitor C2, consider now what happens when an input signal of positive amplitude is presented to the circuit via R1. Current will flow in R1 and a positive voltage will be added to the positive going outputs from $\bar{Q}$. The circuit will maintain a positive going input at D and $\bar{Q}$ will continue negative until sufficient time has elapsed to bring e back to just below the threshold level $V_c$. $\bar{Q}$ will then go positive for one clock pulse, whereupon the combination of the input and the brief positive $\bar{Q}$ pulse will again cause e to exceed the threshold $V_c$ until with $\bar{Q}$ negative e is brought back to just below $V_c$. The $\bar{Q}$ output is therefore a pulse train in which the ratio of spaces to marks is increased compared to the 1:1 ratio of the no-input, or idling, condition. The ratio of spaces to marks is proportional to the amplitude of the input signal. For a negative going input signal the situation is reversed, the number of marks being greater than the number of spaces. However, only a very small change causes the pattern of $\bar{Q}$ pulses generated by the device 11 to be modulated such that the average current flowing in resistor R2 is equal and opposite to that in resistor R1. This change must be held within the limits $+V_p$ and $-V_p$ of the comparator 10 input threshold. Provided the input signal is maintained within these limits the pulse pattern at any given input signal sample has an average analog value equivalent to the signal (when resistor R1 equals resistor R2) and is pulse density modulated.

The maximum input signal peak will be limited to ±Vp because at these levels the $\overline{Q}$ output is an all space or all mark signal. Input signals exceeding these limits will be completely clipped. The time constant $T_o=RC/2$ (when $R1=R2=R$) is chosen so that the maximum signal frequency does not exceed $\frac{1}{2}\pi T_o$.

The dynamic range of the circuits so far described is limited by the coarsest quantizing step which normally occurs at the center of the range (the idling level). This limitation is overcome by the remainder of the circuit of FIG. 1, i.e. the second bistable device 12 and its feedback path. The Q output of device 12 corresponds to the $\overline{Q}$ output of device 11 but is effectively d.c. isolated therefrom. The Q output of device 12 is filtered by resistor R3 and capacitor C2 and provides an analog signal component which is in antiphase to the analog input signal applied via resistor R4. Thus, the resultant signal fed into R1 is related to the analog input signal fed via resistor R4 but modified by negative feedback. The values of resistors R3 and R4 are chosen such that the resultant input signal to resistor R1 is much smaller than the original analog signal applied to resistor R4. However, when the coarse quantizing step at the center of the dynamic range is encountered the temporary cessation in the continuous digitizing process causes the resultant signal to increase considerably due to lack of feedback signal. This results in the device 11 being triggered as though the analog signal has increased but the feedback via resistor R3 will then act to counteract this effect. In fact the original input signal is finally transmitted as modulation superimposed on higher frequency signals composed of rapid transitions about the center step and any other steps that may occur throughout the range.

Figure 2:
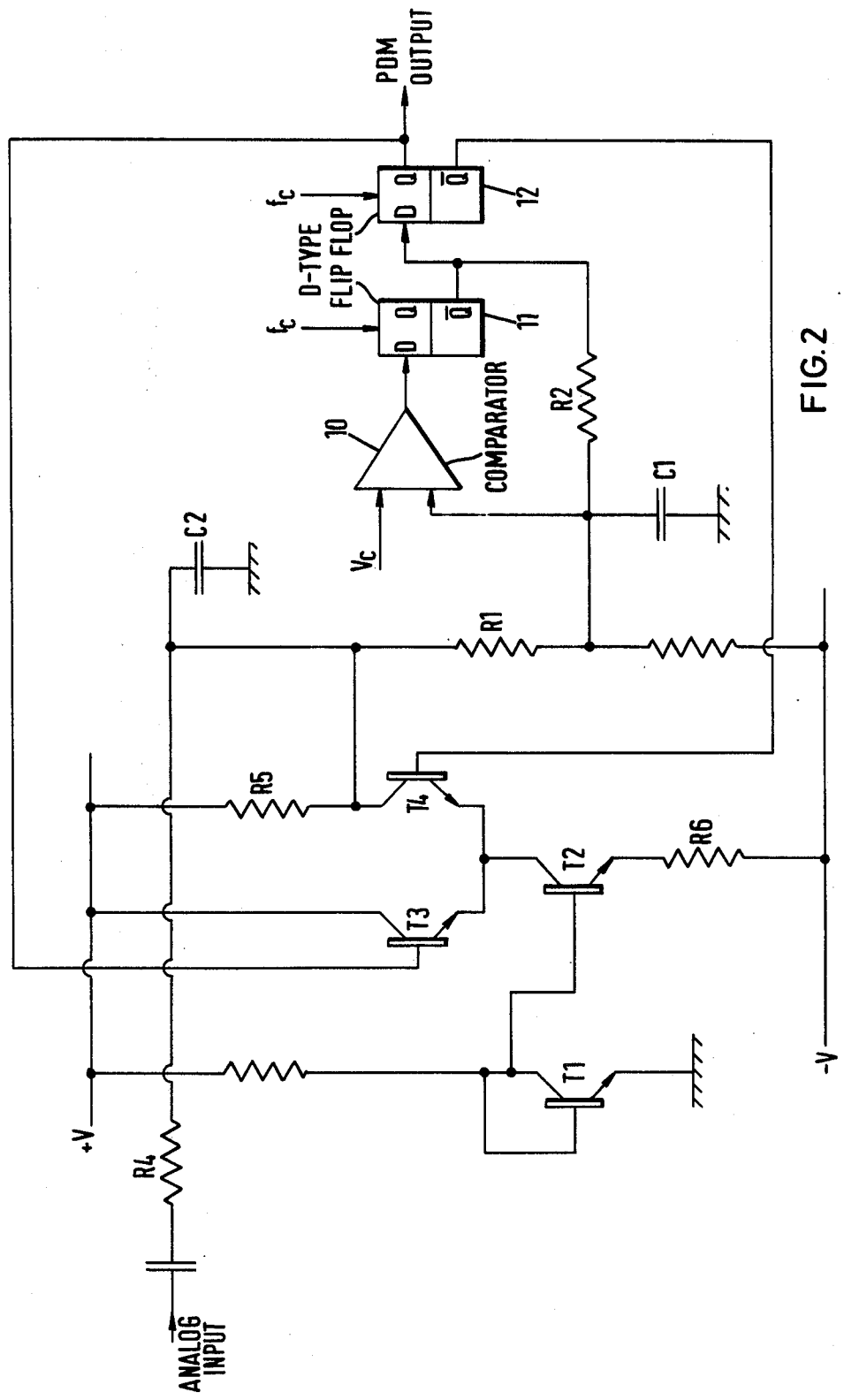
FIG. 2 illustrates a modification of the converter of FIG. 1 to stabilize the converter gain and provide temperature compensation.

The gain of the overall circuit is very closely determined by the ratio of resistor R3 to resistor R4 and also the amplitude of the output pulses from Q of the second device 12. Hence, if the pulse amplitude is stabilized the gain can be determined within small limits by choice of two high stability resistors. This is achieved by the modification of the circuit shown in FIG. 2. The feedback from the Q and $\overline{Q}$ outputs of device 12 are used to switch a constant current to provide a stabilized pulse current to the junction point between resistors R4 and R1, in place of the unstabilized pulse current previously fed back through resistor R3. The Q and $\overline{Q}$ outputs of device 12 are connected to the bases of transistors T3 and T4, respectively, which act as a current switch. The defined constant current for the current switch is determined by a stabilized voltage applied across a high stability resistor R6. Temperature compensation is provided by having two transistors T1 and T2 both passing similar currents and mounting these two transistors on the same chip. The emitter of transistor T2 will thus always be close to ground potential. Any change in the base-emitter voltage of transistor T1 due to temperature change will be the same as for transistor T2. The emitter of transistor T1 will stay close to ground potential.

It will be appreciated that, having a finite dynamic range the converter is required to maintain the range centered about the zero input signal level. If the range is allowed to drift with respect to the zero input signal level then clipping will occur. To maintain the correct centering of the range, the modification shown in FIG. 3 may be adopted. The $\overline{Q}$ output of trigger device 12 is, in addition to being applied to the base of transistor T4, fed to an n-bit counter 13, which may form part of an external equipment. The pulse density modulated (PDM) stream (complementary to the coder output from Q of device 12) is converted into n-bit words with a repetition frequency which is based on a sub-division of the clock frequency $f_c$, i.e. the former is much lower than the latter. The most significant bit (MSB) of the n-bit word is fed back via another bistable trigger device 14, triggered by a clock signal $f_c/2^n$. The feedback circuit has a very long time constant, the integrating circuit being composed of resistor R7 and capacitor C3. Hence, a direct voltage will be acquired by the capacitor C3 the value of which will depend on the mark/space ratio of MSB. The output of the integrating circuit is connected via resistor R9 to the junction of resistor R1, resistor R2, capacitor C1 and the input to comparator 10. This circuit is most sensitive to very low level signals or the zero input signal (idle) condition where there is the inevitable residual noise. If the converter is properly centered the mark/space ratio will be 1:1 and the voltage on capacitor C3 will be zero. A very small drift away from the center will cause the mark/space ratio to become unequal and a voltage of one polarity or the other, depending on the polarity of the drift, will be developed on capacitor C3. This voltage when fed back via resistor R9 will act to pull the operating point of the converter back to the center of the range (provided that the correct phase is used). The loop gain under this condition is high due to the multiplying effect of the counter 13. An alternative but less sensitive arrangement would be to make use of the $\overline{Q}$ output of bistable trigger device 12 to drive the integrator.

Figure 4:
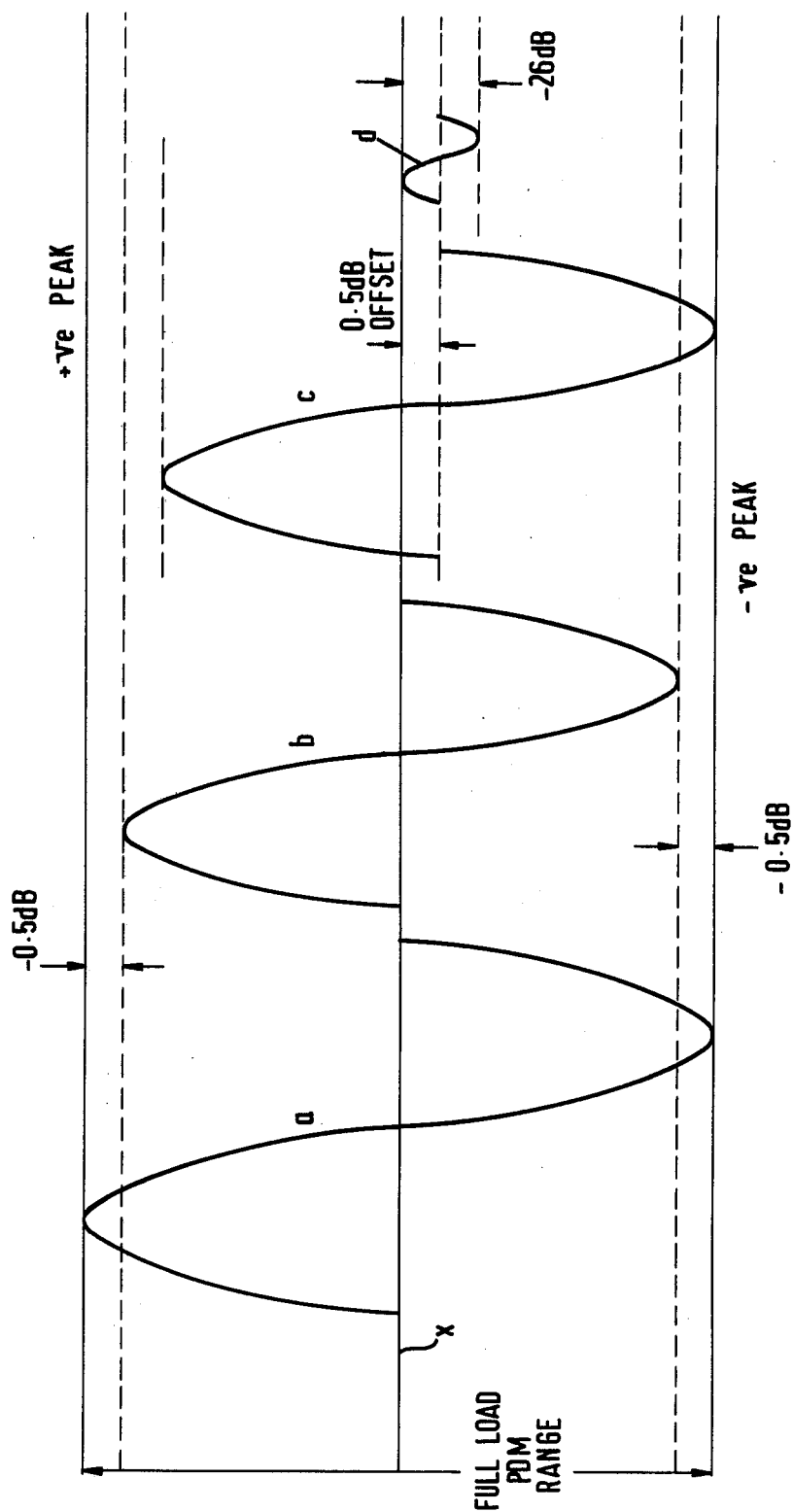
FIG. 4 illustrates graphically the effect of introducing a deliberate controlled amount of d.c. offset for the zero analog signal input condition.

Assuming that it is acceptable to reduce the peak-to-peak signal range of the pulse density modulator by 0.5 dB (decibel), then it is possible to offset deliberately the center so that a comparatively large input signal of only −26 dB down on the peak signal would be needed to cross the center step. This is illustrated in FIG. 4. The full amplitude signal (curve a) is centered about the true center line X. If the peak-to-peak amplitude is reduced by −0.5 dB (curve b), then the whole but reduced range can be offset (curve c). While the offset is only 0.5 dB in relation to the maximum input signal level, it is large enough to accommodate in its entirety an input signal the peak value of which is −26 dB down on the maximum signal (curve d). This would mean that the lower levels of input signal could be digitized and transmitted with a higher signal-to-noise ratio than when operating across the center line X. It would also mean that the zero signal (idle) noise would be similarly reduced. In other words, a large bonus is obtained for low signal levels at the expense of a small reduction in dynamic range.

Figure 3:
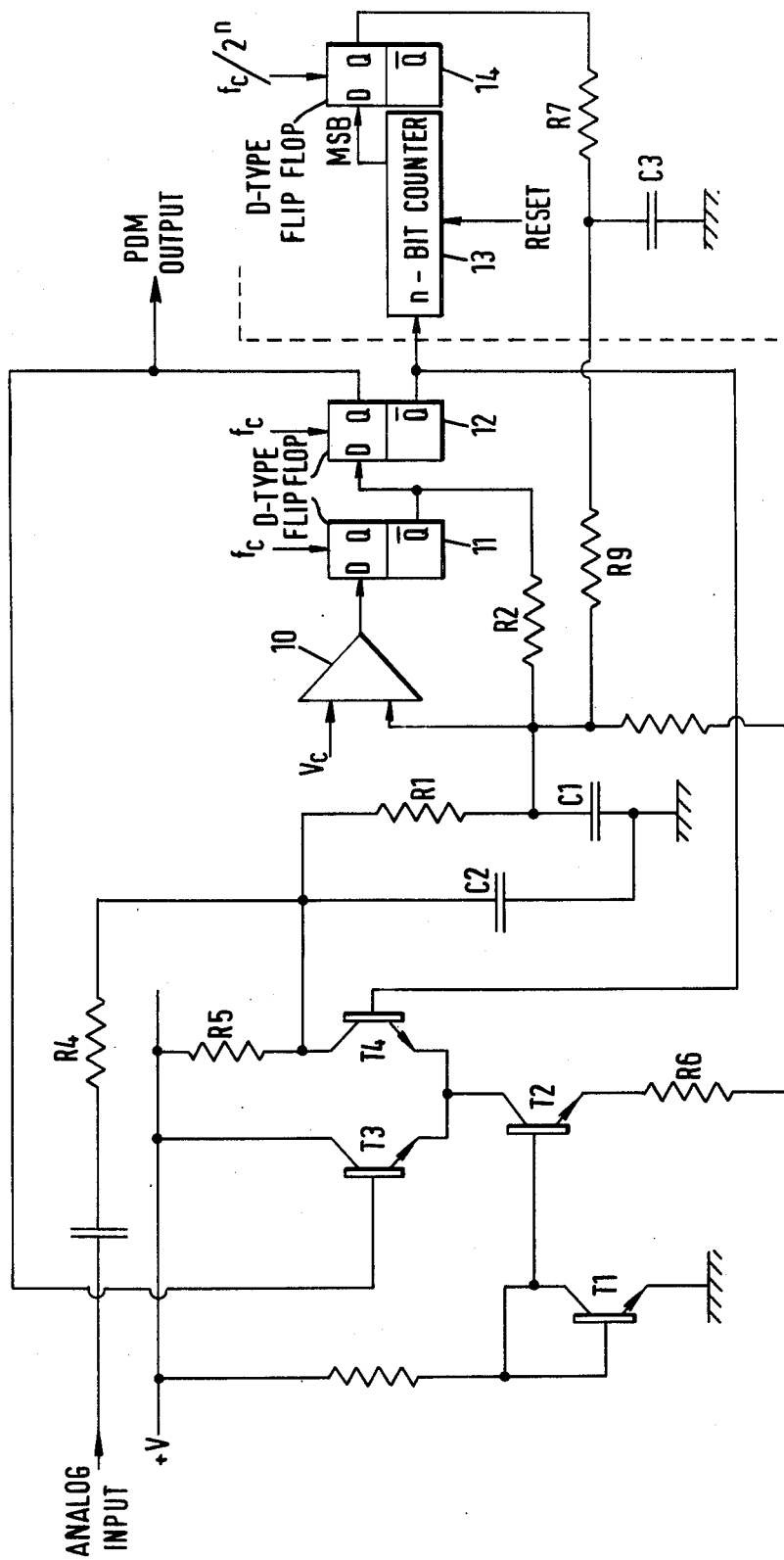
FIG. 3 illustrates a further modification of the converter of FIG. 2 to provide automatic centering of the zero analog signal input condition.
Figure 5:
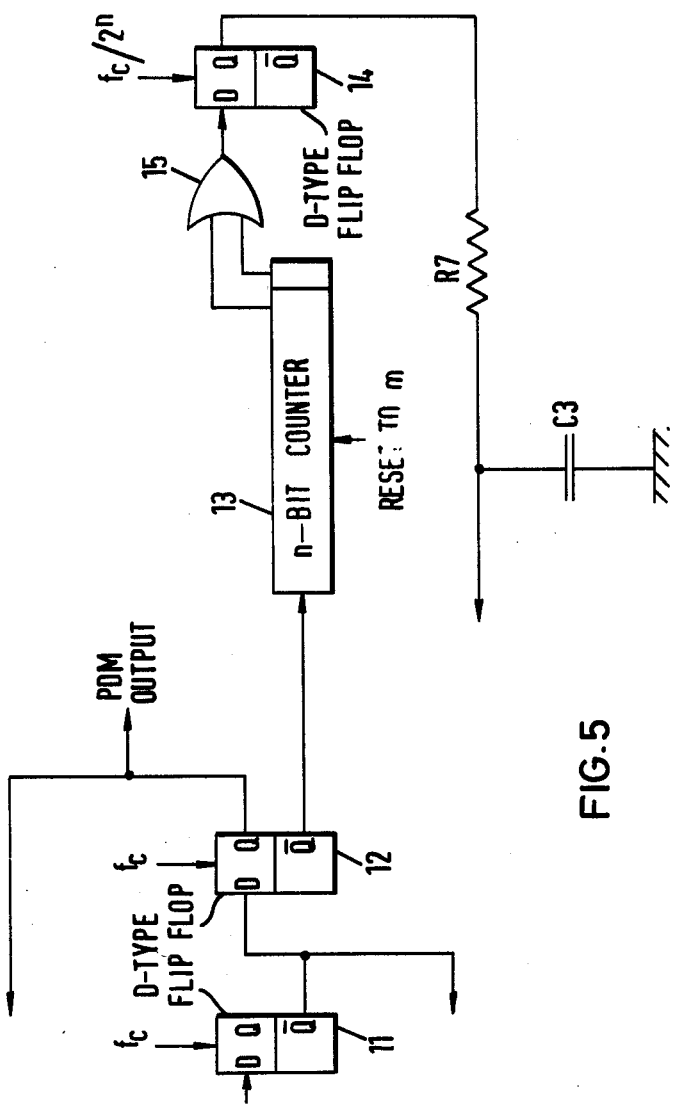
FIG. 5 illustrates one method of providing a deliberate controlled amount of d.c. offset in the arrangement of FIG. 3.

Previously this has been difficult to achieve by reason of ubiquitous d.c. drift, but one convenient way of providing a defined offset is to make use of the auto-centering arrangement of FIG. 3, suitably modified, as shown in FIG. 5.

The pulse density modulated data stream presents a mark/space ratio which represents the d.c. level of the input signal over a given time. Obviously if the input signal is an alternating current then the mark-space pattern will be constantly changing, but the converter will transmit a d.c. signal in the absence of an a.c. signal and this will be regarded as the zero input (idle) condition. If the n-bit counter 13 is always reset to zero so that the most significant bit MSB changes sign when the number of marks in a given period has exceeded $2^{n-1}-1$, which is the normal center level of the converter and the output has an equal mark/space ratio. If now the counter 13 is reset to an arbitrary number m instead of zero then the most significant bit would change after $2^{n-1}-1-m$ marks had occurred and this would automatically pull the zero input signal condition (line X in FIG. 4) to the required working point by the mechanism previously described. The value of m is chosen to fit the desired offset.

As shown in FIG. 5, if the counter 13 is made to count to (n+1) bits and the extra bit is applied to an OR gate 15 together with the $n^{th}$ bit the (MSB) this will prevent overflow of the counter.

While I have described above the principles of my invention in connection with specific apparatus it is to be clearly understood that this description is made only by way of example and not as a limitation to the scope of my invention as set forth in the objects thereof and in the accompanying claims.

I claim:

1. An analog-to-digital converter of the pulse density code type comprising:
   a first bistable trigger circuit having only one conditioning input and a complementing output;
   first means coupled to said first trigger circuit to apply a clock signal thereto;
   second means coupled to said conditioning input of said first trigger circuit to apply an analog signal to be digitized thereto;
   a first feedback circuit coupled from said complementing output to said conditioning input of said first trigger circuit;
   a second bistable trigger circuit having only one conditioning input coupled to said complementing output of said first trigger circuit and a normal output, said second trigger circuit being coupled to said first means to have said clock signal applied thereto;
   a second feedback circuit coupled from said normal output of said second trigger circuit to said second means;
   wherein said first and second feedback circuits are cooperatively constructed so that the amplitude of the signal in said second feedback circuit is substantially less than the amplitude of said analog signal;
   wherein said first feedback path includes third means for integrating the signal at said complementing output of said first trigger circuit; and
   wherein said second feedback path includes fourth means for filtering the signal at said normal output of said second trigger circuit.

2. A converter according to claim 1, wherein said second means includes
   a comparator having said analog signal applied to one terminal, thereof a threshold voltage applied to the other terminal, thereof and an output coupled to said conditioning input of said first trigger circuit.

3. A converter according to claim 2, further including first and second transistors interconnected to form a current switch,
   a constant current source coupled to said current switch, and
   a third feedback path coupled from a complementing output of said second trigger circuit to the base of one of said first and second transistors,
   said second feedback path being coupled to the base of the other of said first and second transistors, and
   the collector of said other of said first and second transistors being coupled to said one terminal of said comparator.

4. A converter according to claim 3, further including fifth means coupled to said constant current source for temperature compensation thereof.

5. A converter according to claim 4, further including
   an n-bit pulse counting means coupled to said complementing output of said second trigger circuit, where n is an integer greater than one, and
   a fourth feedback circuit coupled from said pulse counting means to said one terminal of said comparator.

6. A converter according to claim 5, wherein said fourth feedback circuit includes
   sixth means for selecting the most significant bit of n-bit words having a repetition frequency which is sub-division of the frequency of said clock signal,
   seventh means coupled to said sixth means to integrate signals representing the most significant bits selected, and
   eighth means coupled to said pulse counting means for resetting thereof at the conclusion of each of said n-bit words.

7. A converter according to claim 6, wherein said eighth means is capable of being adjusted to reset said n-bit pulse counting means to a condition corresponding to a count m, where m is an integer greater than zero and $0 < m < n$.

8. A converter according to claim 7, wherein said sixth means includes
   a third bistable trigger circuit having a conditioning input coupled to the most significant counting stage of said n-bit pulse counting means, and
   ninth means coupled to said third bistable trigger circuit to apply a clocking signal equal to said clock signal divided by $2^n$ thereto,
   the normal output of said third bistable trigger circuit being coupled to said seventh means.

9. A converter according to claim 5, further including third means coupled to said constant current source for temperature compensation thereof.

10. A converter according to claim 9, further including
    an n-bit pulse counting means coupled to said complementing output of said second trigger circuit, where n is an integer greater than one, and
    a fourth feedback circuit coupled from said n-bit pulse counting means to said one terminal of said comparator.

11. A converter according to claim 10, wherein said fourth feedback circuit includes
    fourth means for selecting the most significant bit of n-bit words having a repetition frequency which is a sub-division of the frequency of said clock signal,
    fifth means coupled to said fourth means to integrate signals representing the most significant bits selected, and
    sixth means coupled to said pulse counting means for resetting thereof at the conclusion of each of said n-bit words.

12. A converter according to claim 8, wherein said n-bit pulse counting means includes at least (n+1) stages to count to (n+1) bits, and further including
    an OR gate coupled to the $n^{th}$ and the $(n+1)^{th}$ stages of said n-bit pulse counting means, said OR gate having an output coupled to said conditioning input of said third trigger circuit.

13. A converter according to claim 1, wherein said first feedback path includes third means for integrating the signal at said complementing output of said first trigger circuit.

14. A converter according to claim 13, wherein said second feedback path includes
fourth means for filtering the signal at said normal output of said second trigger circuit.

15. A converter according to claim 14, wherein said second means includes
a comparator having said analog signal applied to one terminal, thereof a threshold voltage applied to the other terminal, and an output coupled to said conditioning input of said first trigger circuit.

16. A converter according to claim 15, further including
first and second transistors interconnected to form a current switch,
a constant current source coupled to said current switch, and
a third feedback path coupled from a complementing output of said second trigger circuit to the base of one of said first and second transistors,
said second feedback path being coupled to the base of the other of said first and second transistors, and
the collector of said other of said first and second transistors being coupled to said one terminal of said comparator.

17. A converter according to claim 16, further including
fifth means coupled to said constant current source for temperature compensation thereof.

18. A converter according to claim 17, further including
an n-bit pulse counting means coupled to said complementing output of said second trigger circuit, where n is an integer greater than one, and
a fourth feedback circuit coupled from said pulse counting means to said one terminal of said one terminal of said comparator.

19. A converter according to claim 18, wherein said fourth feedback circuit includes
sixth means for selecting the most significant bit of n-bit words having a repetition frequency which is a sub-division of the frequency of said clock signal,
seventh means coupled to said sixth means to integrate signals representing the most significant bits selected, and
eighth means coupled to said pulse counting means for resetting thereof at the conclusion of each of said n-bit words.

20. A converter according to claim 19, wherein said eighth means is capable of being adjusted to reset said n-bit pulse counting means to a condition corresponding to a count m, where m is an integer greater than zero and $0 < m < n$.

21. A converter according to claim 20, wherein said sixth means includes
a third bistable trigger circuit having a conditioning input coupled to the most significant counting stage of said n-bit pulse counting means, and
ninth means coupled to said third bistable trigger circuit to apply a clocking signal equal to said clock signal divided by $2^n$ thereto, the normal output of said third bistable trigger circuit being coupled to said seventh means.

22. A converter according to claim 21, wherein said n-bit pulse counting means includes at least (n+1) stages to count to (n+1) bits, and further including
an OR gate coupled to the $n^{th}$ and the (n+1) stages of said n-bit pulse counting means, said OR gate having an output coupled to said conditioning input of said third trigger circuit.

23. A converter according to claim 1, wherein said second feedback path includes
third means for filtering the signal at said normal output of said second trigger circuit.

24. A converter according to claim 23, wherein said second means includes
a comparator having said analog signal applied to one terminal, a threshold voltage applied to the other terminal, and an output coupled to said conditioning input of said first trigger circuit.

25. A converter according to claim 24, further including
first and second transistors interconnected to form a current switch,
a constant current source coupled to said current switch, and
a third feedback path coupled from a complementing output of said second trigger circuit to the base of one of said first and second transistors,
said second feedback path path being coupled to the base of the other of said first and second transistors, and
the collector of said other of said first and second transistors being coupled to said one terminal of said comparator.

26. A converter according to claim 1, wherein said second means includes
a comparator having said analog signal applied to one terminal, a threshold voltage applied to the other terminal, and an output coupled to said conditioning input of said first trigger circuit.

27. A converter according to claim 26, further including
first and second transistors interconnected to form a current switch,
a constant current source coupled to said current switch, and
a third feedback path coupled from a complementing output of said second trigger circuit to the base of one of said first and second transistors,
said second feedback path being coupled to the base of said first and second transistors, and
the collector of said other of said first and second transistors being coupled to said one terminal of said comparator.

28. A converter according to claim 27, further including
third means coupled to said constant current source for temperature compensation thereof.

29. A converter according to claim 1, further including
first and second transistors interconnected to form a current switch,
a constant current source coupled to said current switch, and
a third feedback path coupled from a complementing output of said second trigger circuit to the base of one of said first and second transistors,
said second feedback path being coupled to the base of the other of said first and second transistors, and
the collector of said other of said first and second transistors being coupled to said one terminal of said comparator.

30. A converter according to claim 29, further including
third means coupled to said constant current source for temperature compensation thereof.

31. A converter according to claim 30, further including
an n-bit pulse counting means coupled to complementing output of said second trigger circuit, where n is an integer greater than one, and
a fourth feedback circuit coupled from said pulse counting means to said one terminal of said comparator.

* * * * *